(12) United States Patent
Seong

(10) Patent No.: US 11,011,092 B2
(45) Date of Patent: May 18, 2021

(54) DISPLAY APPARATUS AND DRIVING METHOD THEREOF

(71) Applicant: MagnaChip Semiconductor, Ltd., Cheongju-si (KR)

(72) Inventor: Eun Kyu Seong, Cheongju-si (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 53 days.

(21) Appl. No.: 16/531,179

(22) Filed: Aug. 5, 2019

(65) Prior Publication Data

US 2020/0058243 A1    Feb. 20, 2020

(30) Foreign Application Priority Data

Aug. 14, 2018 (KR) .................. 10-2018-0095171

(51) Int. Cl.
 *G09G 3/20* (2006.01)
 *H03K 19/20* (2006.01)
(52) U.S. Cl.
 CPC .............. *G09G 3/20* (2013.01); *H03K 19/20* (2013.01); *G09G 2320/0276* (2013.01)

(58) Field of Classification Search
 CPC ............................................. G09G 3/20–2096
 See application file for complete search history.

(56) References Cited

U.S. PATENT DOCUMENTS

| | | | |
|---|---|---|---|
| 7,068,392 B2 * | 6/2006 | Chiu | G06F 1/0356 358/1.9 |
| 2013/0141474 A1 * | 6/2013 | Kim | G09G 3/3674 345/690 |
| 2017/0213495 A1 | 7/2017 | Lee | |

* cited by examiner

*Primary Examiner* — Hang Lin
(74) *Attorney, Agent, or Firm* — NSIP Law

(57) ABSTRACT

A decoder of a display apparatus and a decoding method thereof is provided. The decoder comprises a first switching control block configured to select at least two section values from a plurality of gamma gray level values based on predetermined low bits of inputted data, and a second switching control block configured to select section values from the at least two selected section values based on predetermined high bits of the data and output at least two channel values.

18 Claims, 9 Drawing Sheets

FIG. 3 (Related Art)

| GAMMA Input | Decoder Input (Display data) | | | | | | | | Decoder Output (selection Gray) |
|---|---|---|---|---|---|---|---|---|---|
| Gray | D7 | D6 | D5 | D4 | D3 | D2 | D1 | D0 | CH IN |
| 0 | 0 | 0 | 0 | 0 | 0 | 0 | 0 | 0 | 0 |
| 1 | 0 | 0 | 0 | 0 | 0 | 0 | 0 | 1 | 1 |
| 2 | 0 | 0 | 0 | 0 | 0 | 0 | 1 | 0 | 2 |
| 3 | 0 | 0 | 0 | 0 | 0 | 0 | 1 | 1 | 3 |
| 4 | 0 | 0 | 0 | 0 | 0 | 1 | 0 | 0 | 4 |
| 5 | 0 | 0 | 0 | 0 | 0 | 1 | 0 | 1 | 5 |
| 6 | 0 | 0 | 0 | 0 | 0 | 1 | 1 | 0 | 6 |
| 7 | 0 | 0 | 0 | 0 | 0 | 1 | 1 | 0 | 7 |
| 8 | 0 | 0 | 0 | 0 | 1 | 0 | 0 | 0 | 8 |
| 9 | 0 | 0 | 0 | 0 | 1 | 0 | 0 | 1 | 9 |
| 10 | 0 | 0 | 0 | 0 | 1 | 0 | 1 | 0 | 10 |
| 11 | 0 | 0 | 0 | 0 | 1 | 0 | 1 | 1 | 11 |
| 12 | 0 | 0 | 0 | 0 | 1 | 1 | 0 | 0 | 12 |
| 13 | 0 | 0 | 0 | 0 | 1 | 1 | 0 | 1 | 13 |
| 14 | 0 | 0 | 0 | 0 | 1 | 1 | 1 | 0 | 14 |
| 15 | 0 | 0 | 0 | 0 | 1 | 1 | 1 | 1 | 15 |
| 16 | 0 | 0 | 0 | 1 | 0 | 0 | 0 | 0 | 16 |
| 17 | 0 | 0 | 0 | 1 | 0 | 0 | 0 | 1 | 17 |
| 18 | 0 | 0 | 0 | 1 | 0 | 0 | 1 | 0 | 18 |
| 19 | 0 | 0 | 0 | 1 | 0 | 0 | 1 | 1 | 19 |
| 20 | 0 | 0 | 0 | 1 | 0 | 1 | 0 | 0 | 20 |
| 21 | 0 | 0 | 0 | 1 | 0 | 1 | 0 | 1 | 21 |
| 22 | 0 | 0 | 0 | 1 | 0 | 1 | 1 | 0 | 22 |
| 23 | 0 | 0 | 0 | 1 | 0 | 1 | 1 | 1 | 23 |
| 24 | 0 | 0 | 0 | 1 | 1 | 0 | 0 | 0 | 24 |
| 25 | 0 | 0 | 0 | 1 | 1 | 0 | 0 | 1 | 25 |
| 26 | 0 | 0 | 0 | 1 | 1 | 0 | 1 | 0 | 26 |
| 27 | 0 | 0 | 0 | 1 | 1 | 0 | 1 | 1 | 27 |
| 28 | 0 | 0 | 0 | 1 | 1 | 1 | 0 | 0 | 28 |
| 29 | 0 | 0 | 0 | 1 | 1 | 1 | 0 | 1 | 29 |
| 30 | 0 | 0 | 0 | 1 | 1 | 1 | 1 | 0 | 30 |
| 31 | 0 | 0 | 0 | 1 | 1 | 1 | 1 | 1 | 31 |
| 240 | 1 | 1 | 1 | 1 | 0 | 0 | 0 | 0 | 240 |
| 241 | 1 | 1 | 1 | 1 | 0 | 0 | 0 | 1 | 241 |
| 242 | 1 | 1 | 1 | 1 | 0 | 0 | 1 | 0 | 242 |
| 243 | 1 | 1 | 1 | 1 | 0 | 0 | 1 | 1 | 243 |
| 244 | 1 | 1 | 1 | 1 | 0 | 1 | 0 | 0 | 244 |
| 245 | 1 | 1 | 1 | 1 | 0 | 1 | 0 | 1 | 245 |
| 246 | 1 | 1 | 1 | 1 | 0 | 1 | 1 | 0 | 246 |
| 247 | 1 | 1 | 1 | 1 | 0 | 1 | 1 | 1 | 247 |
| 248 | 1 | 1 | 1 | 1 | 1 | 0 | 0 | 0 | 248 |
| 249 | 1 | 1 | 1 | 1 | 1 | 0 | 0 | 1 | 249 |
| 250 | 1 | 1 | 1 | 1 | 1 | 0 | 1 | 0 | 250 |
| 251 | 1 | 1 | 1 | 1 | 1 | 0 | 1 | 1 | 251 |
| 252 | 1 | 1 | 1 | 1 | 1 | 1 | 0 | 0 | 252 |
| 253 | 1 | 1 | 1 | 1 | 1 | 1 | 0 | 1 | 253 |
| 254 | 1 | 1 | 1 | 1 | 1 | 1 | 1 | 0 | 254 |
| 255 | 1 | 1 | 1 | 1 | 1 | 1 | 1 | 1 | 255 |

| GAMMA Input | Decoder Input (Display data) | | | | | | | | Decoder Output | | | |
|---|---|---|---|---|---|---|---|---|---|---|---|---|
| | 1st S/W control | | | | 2st S/W control | | | | | | | |
| Gray | D7 | D6 | D5 | D4 | D3 | D2 | D1 | D0 | CH1 | CH2 | CH3 | CH4 |
| 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 1 | 1 | 1 | 1 |
| 2 | 0 | 0 | 0 | 0 | 0 | 0 | 1 | 0 | 2 | 2 | 2 | 2 |
| 3 | 0 | 0 | 0 | 0 | 0 | 0 | 1 | 1 | 3 | 3 | 3 | 3 |
| ⋮ | ⋮ | | | | ⋮ | | | | ⋮ | | | |
| A | | | | | | | | | | | | |
| | 0 | 0 | 0 | 1 | 0 | 0 | 0 | 0 | B | A | A | A |
| | 0 | 0 | 0 | 1 | 0 | 0 | 0 | 1 | B | B | A | A |
| | 0 | 0 | 0 | 1 | 0 | 0 | 1 | 0 | B | A | B | B |
| B | 0 | 0 | 0 | 1 | 0 | 0 | 1 | 1 | B | B | B | B |
| | 0 | 0 | 0 | 1 | 0 | 1 | 0 | 0 | C | B | B | B |
| | 0 | 0 | 0 | 1 | 0 | 1 | 0 | 1 | C | C | B | B |
| | 0 | 0 | 0 | 1 | 0 | 1 | 1 | 0 | C | B | C | C |
| C | 0 | 0 | 0 | 1 | 0 | 1 | 1 | 1 | C | C | C | C |
| | 0 | 0 | 0 | 1 | 1 | 0 | 0 | 0 | D | C | C | C |
| | 0 | 0 | 0 | 1 | 1 | 0 | 0 | 1 | D | D | C | C |
| | 0 | 0 | 0 | 1 | 1 | 0 | 1 | 0 | D | C | D | D |
| D | 0 | 0 | 0 | 1 | 1 | 0 | 1 | 1 | D | D | D | D |
| | 0 | 0 | 0 | 1 | 1 | 1 | 0 | 0 | E | D | D | D |
| | 0 | 0 | 0 | 1 | 1 | 1 | 0 | 1 | E | E | D | D |
| | 0 | 0 | 0 | 1 | 1 | 1 | 1 | 0 | E | D | E | E |
| E | 0 | 0 | 0 | 1 | 1 | 1 | 1 | 1 | E | E | E | E |
| ⋮ | ⋮ | | | | ⋮ | | | | ⋮ | | | |

FIG. 5

DISPLAY APPARATUS AND DRIVING METHOD THEREOF

CROSS-REFERENCE TO RELATED APPLICATION

This application claims the benefit under 35 U.S.C. 119(a) of Korean Patent Application No. 10-2018-0095171 filed on Aug. 14, 2018 in the Korean Intellectual Property Office, the entire disclosure of which is incorporated herein by reference for all purposes.

BACKGROUND

1. Field

The following description relates to a display apparatus, a decoder driving the display apparatus, a display apparatus including the decoder, and a driving method thereof.

2. Description of Related Art

A source driver displays images by converting digital signals that correspond to image data desired to be displayed into analog voltages, and supplies the analog voltages to each pixel of a display panel.

FIG. 1 illustrates an example of a display apparatus.

Referring to FIG. 1, a display panel may include a plurality of data lines and a plurality of gate lines and a plurality of pixels formed at an intersecting point of respective data lines and respective gate lines.

Each pixel (not illustrated) may include a transistor and a pixel capacity, and data may be entered by charging analog voltages that correspond to gray level of images desired to be displayed in each pixel capacity.

FIG. 2 is a block diagram of a source driver according to a comparative example, and FIG. 3 is a data decoding table illustrating the operation of a source driver according to a comparative example.

Referring to FIG. 2, a common source driver may include a main controller 11, at least one channel decoder 12-1 to 12-$n$, and at least one channel amplifier 15-1 to 15-$n$ as illustrated in FIG. 2. The at least one channel decoder 12-1 to 12-$n$ receives gray level voltages from a gamma block 40, and outputs gray level voltages SOUT corresponding to data (Display data) input from the main controller.

When data is n bits (where n is a natural number greater than or equal to 1), a gamma gray level value input to the at least one channel decoder 12-1 to 12-$n$ has a voltage level that is obtained by dividing a difference between a ground voltage and a power voltage by $2^n$ stages. For example, if Display data is 6 bits, a gamma gray level value is a value obtained by dividing a difference between a supply voltage and a ground voltage by 64 stages, and if Display data is 8 bits, a gamma gray level value is a value obtained by dividing a difference between a supply voltage and a ground voltage by 256 stages.

In the current display device environment that requires high performance as well as high resolution, gamma gray level value increases as the amount of data increases according to high resolution.

FIG. 3 illustrates 256 stages of gamma gray level values when data is 8 bits.

In the comparative example of FIGS. 2 and 3, inputs may be made to the decoder so that each gamma line corresponds to each one of gamma gray level values, and the decoder selects and output one of a plurality of gamma gray level values according to data inputted. That is, according to the comparative example, the increase in data amount in accordance with resolution means the increase in gamma lines inputted from a gamma block 40 to the decoder as illustrated, and it is necessary to reduce the number of gamma lines, considering a design area and a parasitic capacitance between each line.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a display apparatus includes a decoder, the decoder includes a first switching control block configured to select at least two section values from a plurality of gamma gray level values based on predetermined high bits of inputted data, and a second switching control block configured to select section values from the at least two selected section values based on predetermined low bits of the data and output at least two channel values.

When the gamma gray level values are in a configuration section, the second switching control block may include a non-interpolation control block that is configured to output the gamma gray level values themselves as the channel values based on the inputted data.

The configuration section may be one of a predetermined low gray section, an intermediate gray section, and a high gray section.

The first switching control block may be configured to select the at least two section values from the plurality of gamma gray level values based on first high bits of the predetermined high bits and second high bits of the predetermined high bits.

The first switching control block may include a NAND logic circuit configured to output a first enable signal based on the first high bits and the second high bits, an inverter (NOT) circuit configured to receive the first enable signal and output a second enable signal, and selectors configured to select the at least two section values from the gamma gray level values based on the first enable signal and the second enable signal.

The second switching control block may be configured to select the at least two section values based on first low bits, and combine and output the selected at least two section values based on second low bits as the at least two channel values.

If the second low bits are first condition, the second switching control block may select three first section values and one second section value, if the second low bits are second condition, the second switching control block selects two first section values and two second section values, if the second low bits are third condition, the second switching control block selects one first section value and three second section values, and if the second low bits are fourth condition, the second switching control block selects zero first section value and four second section values.

The display apparatus may include the decoder, and a source driver comprising an amplifier configured to average the at least two channel values and output a luminance value.

The amplifier may include a plurality of first individual amplifiers configured to receive and amplify respective channel values and the luminance value, and a second amplifier configured to output the luminance value, wherein the luminance value may be obtained by adding and averaging output values of the first individual amplifiers.

In a general aspect, a driving method of a display apparatus for outputting channel values by receiving first data comprising a plurality of bits and second data comprising a plurality of level values, the method includes selecting a plurality of section values from the second data based on a predetermined number of high bits of the first data, and selecting and outputting at least two section values from the plurality of section values as channel values based on a predetermined number of low bits of the first data.

If the high bits of the first data are a predetermined non-interpolation condition, the method may further include outputting a level value corresponding to the second data as the outputted channel value.

The selecting the at least two section values as channel values may include selecting the section values based on first low bits while the high bits of the first data are the same, and combining the selected section values based on changing second low bits while the first low bits are the same.

The channel value may include four channel values, and the combining of the selected section values may include selecting three of first section values and one of second section values if the second low bits are a first condition, selecting two of the first section values and two of the second section values if the second low bits are a second condition, selecting one of the first section values and three of the second section values if the second low bits are a third condition, and selecting zero of the first section values and four of the second section values if the second low bits are a fourth condition.

The section values may be output values corresponding to values where the high bits of the first data and first low bits are identical and the second low bits are all 1.

The method may further include averaging the channel values to output a luminance value, wherein the first data is data input from a main controller, and the second data is a gamma gray level value input from a gamma block.

In a general aspect, a display apparatus includes a decoder and a source driver, the decoder includes a non-interpolation control block configured to output gamma gray level values of a predetermined section among a plurality of gamma gray level values as channel values, a first switching control block configured to select a plurality of section values among remaining gamma gray level values based on predetermined high bits of data inputted from a main controller, and a second switching control block configured to combine the selected plurality of section values based on remaining low bits of the data and output the combination of the plurality of section values as a plurality of channel values, and wherein the source driver is configured to average the plurality of channel values and output the averaged value as a luminance value.

When the plurality of gamma gray level values is divided into predetermined sections, a maximum number of section values may be set among the gamma gray level values in each of the predetermined sections.

The second switching control block may be further configured to select the plurality of section values as $2^n$ combinations, and output the combinations of the section values as the plurality of channel values, if the number of the remaining low bits are n.

In a general aspect, display apparatus includes a decoder and a source driver, wherein the source driver is configured to average a plurality of channel values and output an averaging value as a luminance value, wherein the decoder is configured to output the plurality of channel values by receiving N bits data and a plurality of gamma gray level values, and wherein the decoder includes: a rear switching control block configured to combine two first section values to interpolate into the plurality of channel values based on the least significant two bits of the N bits data, an intermediate switching control block configured to interpolate five second section values into the two first section values based on two middle bits before the least significant two bits in the N bits data; and a front switching control block configured to interpolate the plurality of gamma gray level values into the five second section values based on four forward bits before two middle bits of the N bits data, wherein N is a natural number.

The data may be more than 8 bits (N>8), wherein a number of the front switching control blocks is as twice as many as a number of rest bits, wherein the rest bits are at least two bits from the most significant bit to the front bit of the four forward bits in the N bits data, and wherein the decoder further comprises a multiplexer configured to select any one of the plurality of the front switching control blocks based on the rest bits, and output the five second section values to the intermediate switching control block.

The decoder may further include a non-interpolation control block configured to output the gamma gray level values of a predetermined section among the plurality of gamma gray level values as a channel value.

In a general aspect, a display apparatus includes a decoder including a front switching control block configured to divide a plurality of gamma gray levels into a predetermined number of sections based on the most significant four bits among 8-bit data and output five section values, an intermediate switching control block configured to select and output two second section values from the five section values, and a rear switching control block configured to output a plurality of channel values by combining the two second section values.

Other features and aspects will be apparent from the following detailed description, the drawings, and the claims.

BRIEF DESCRIPTION OF THE DRAWINGS

FIG. 3 is a data decoding table illustrating an operation of a source driver according to a comparative example.

FIG. 5 is a data decoding table illustrating an operation of a source driver in accordance with one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
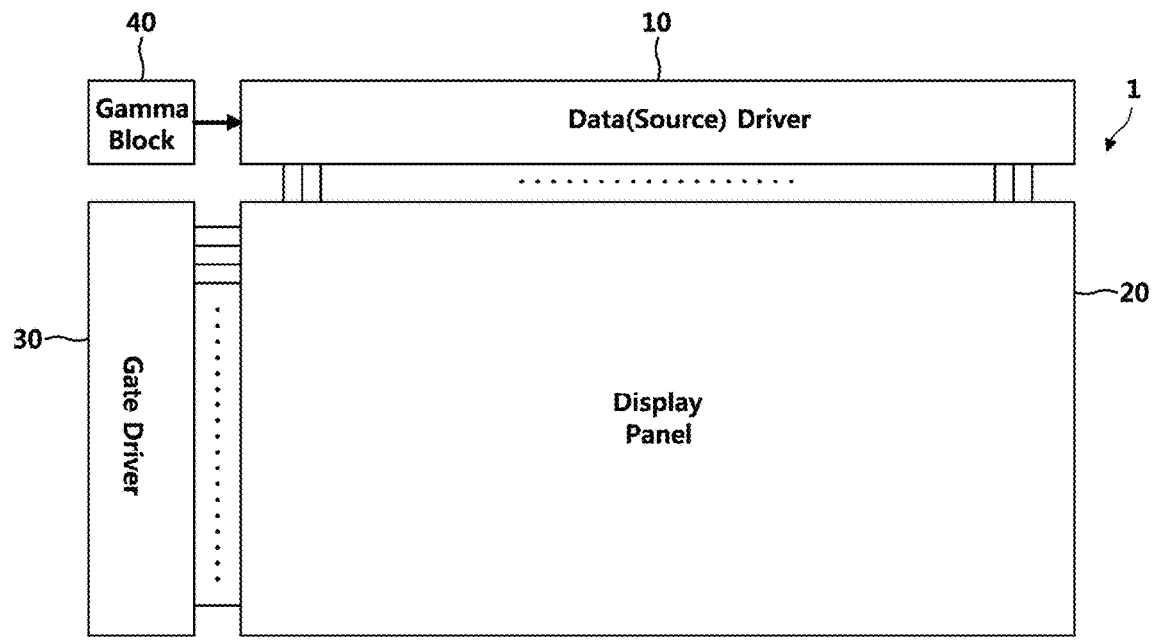
FIG. 1 is an example of a block diagram of a display apparatus.
Figure 2:
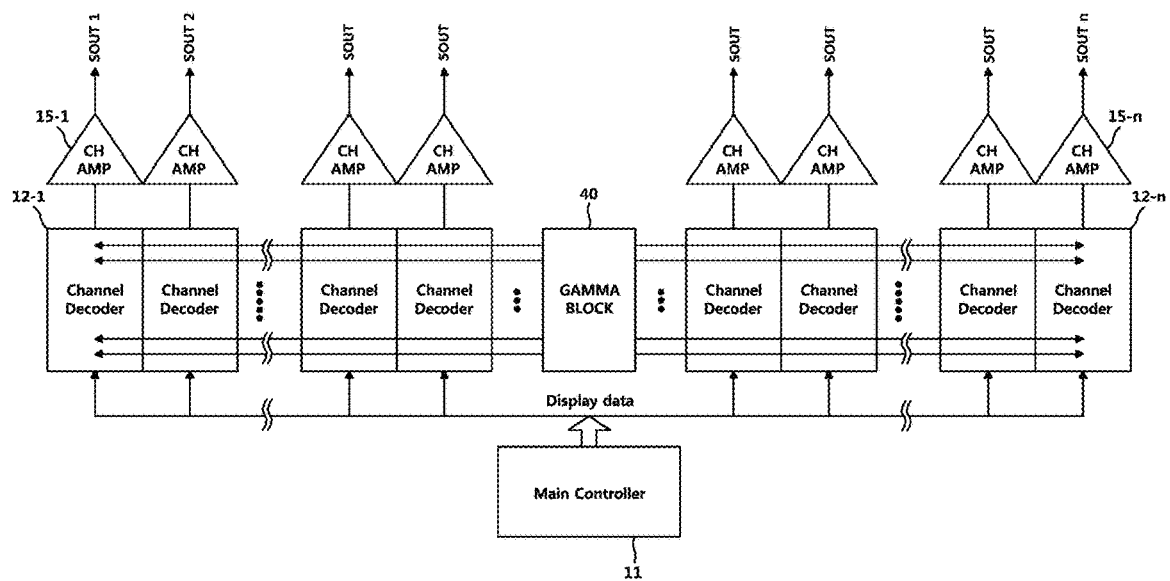
FIG. 2 is an example of a block diagram of a source driver according to a comparative example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

In the following disclosure, the singular form of a word is interchangeably used with the term "at least one" and means one or more of the elements being described.

In the following disclosure, for the convenience of description, it is described that a display data is 8 bits and gamma gray level values are 0 to 255, but the scope of the present disclosure is not limited thereto, and it should be understood that the number of display data bits and gamma gray level values according to the resolution of a display apparatus may have different values.

To resolve the above-mentioned problem, a display apparatus including a decoder that reduces a number of gamma lines and accordingly reducing its size and a driving method thereof is provided.

Figure 4:
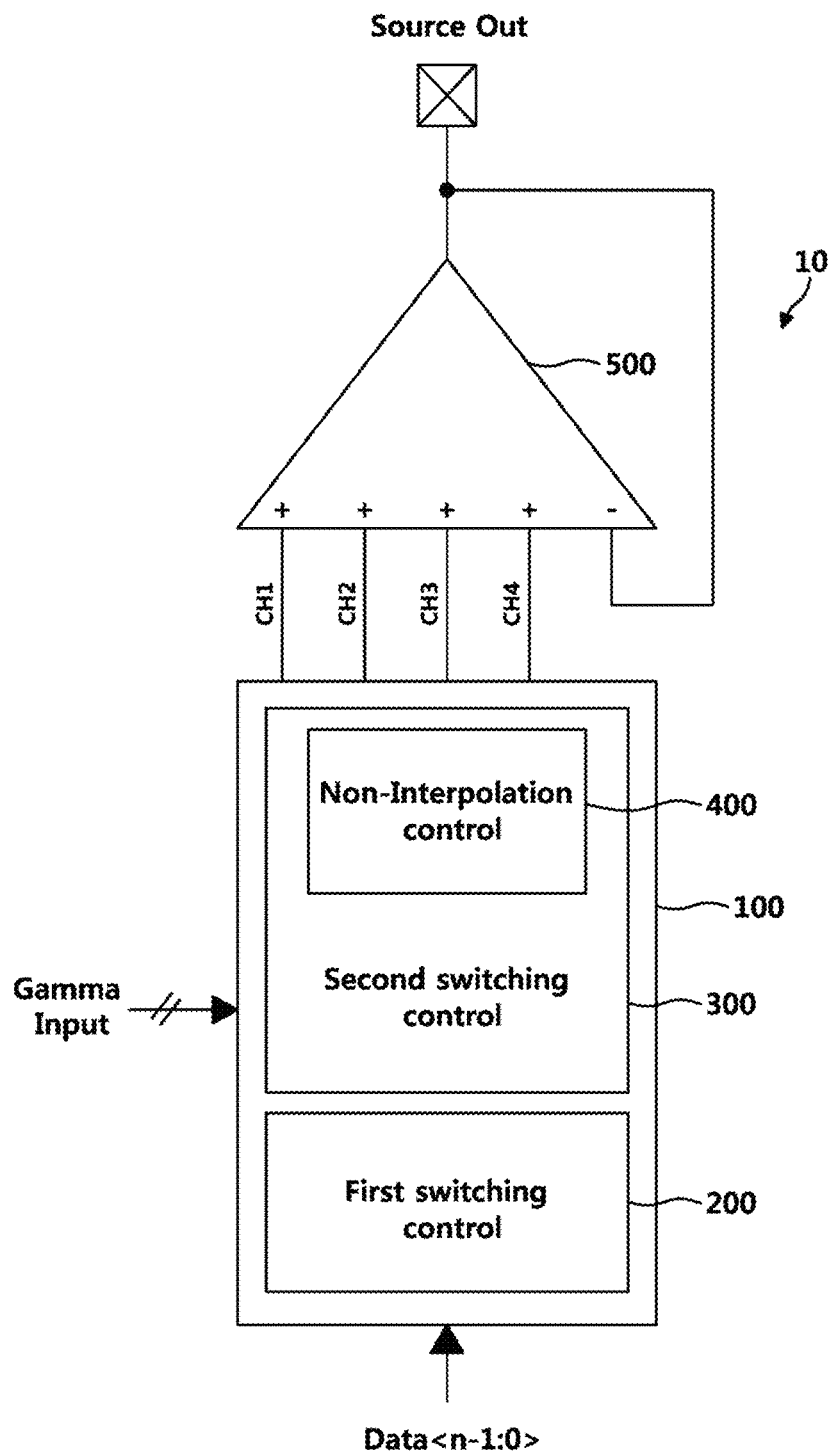
FIG. 4 illustrates an example of a block diagram of a source driver in accordance with one or more embodiments.

FIG. 4 illustrates a block diagram of an example of a source driver, and FIG. 5 is an example of a data decoding table for illustrating an operation of a source driver.

Referring to FIG. 4, a source driver 10 includes a decoder 100 and an amplifier 500.

The decoder 100 may receive display data (that is, first data) Data<n−1:0> and gamma input (that is, second data) and may output at least two channel values. The channel values may be gamma gray level values corresponding to the inputted first data among the second data. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The amplifier 500 averages a plurality of channel values and outputs an averaged value as an output value. At this time, the output value may be a gray level voltage value inputted to a display panel.

The decoder 100 includes a first switching control block 200 and a second switching control block 300.

The first switching control block 200 selects at least two or more section values from a plurality of gamma gray levels based on predetermined high bits of inputted data. That is, the first switching control block selects at least two section values from a plurality of gamma gray level values based on first high bits and second high bits of the predetermined high bits.

With further reference to FIG. 5, let's assume that data inputted is 8 bits (that is, n=8, data <n−1:0> is D[7:0]), it is divided into 4 high bits D[7:4] and 4 low bits D[3:0]). The predetermined low bits can be divided into first low bits D[3:2] and second low bits D[1:0]. In this example, it is described that input data is divided in half and into high bits and low bits, but the examples are not limited thereto. According to another example, data may be divided into high bits and low bits, and the number of the high/low bits may not be in half depending on the particular circuit implementation.

In regard to the same sections of the high bits D[7:4] of FIG. 5 as '0001', output values of a source driver may have 16 gamma gray level values in accordance with the change in low bits D[3:0]. At this time, a number of sections where first low-order bits are identical is four, and each section may have four values according to the change in second low-order bits. In the present disclosure, a section having the same high bits is referred to as a first unit section, and a section having the same first low bits within the first unit section is referred to as a second unit section.

A section value, which is a value corresponding to a maximum value of the second unit section, is an output value corresponding to when the second low bits are all 1, and referring to FIG. 5, a gamma gray level value is B when D[7:0] is 00010011; the gamma gray level value is C when D[7:0] is 00010111; the gamma gray level value is D when D[7:0] is 00011011; and the gamma gray level value is E when D[7:0] is 00011111.

The first switching control block 200 selects A, B, C, D, E section values based on high bits D[7:4]. At this time, section value A is a prior section of the first unit section, that is, a maximum value in the sections with the same high bits. That is, A is a gamma gray level value corresponding to the maximum value of 1111 in the prior first unit section whose high bits are the same as 0000.

The second switching control block 300 may select at least two section values from the selected section values based on the predetermined low bits of data, and output them as channel values. That is, the second switching control block 300 may select at least two section values from the section values based on the first low bits D[3:2] and combine and output the section values as the channel values based on second low bits D[1:0].

Describing with reference to the illustrated example, the second switching control block 300 selects two section values (A and B, B and C, C and D, or D and E) from five representative values A, B, C, D, E based on first low bits. For example, if D[7:2] is 000100, A and B may be selected as section values, and channel values may be output according to second low bits.

For example, if second low bits are first condition (00), one first section value (B) and three second section values (A) are output as channel values. For example, if second low bits are second condition (01), two first section values (B) and two second section values (A) are output as channel values. For example, if second low bits are third condition (10), three first section values (B) and one second section value (A) are output as channel values. For example, if second low bits are fourth condition (11), four first section values (B) are output as channel values.

The amplifier 500 receives a plurality of channel values, averages the channel values, and outputs them as a luminance value. In the above example, if the second low bits are first condition (00), the luminance value is $$\frac{(A \times 3 + B \times 1)}{4};$$

if the second low bits are second condition (01), the luminance value is $$\frac{(A \times 2 + B \times 2)}{4};$$

if the second low bits are third condition (10), the luminance value is $$\frac{(A \times 1 + B \times 3)}{4};$$

and if the second low bits are fourth condition (11), the luminance value is $$\frac{(A \times 0 + B \times 4)}{4}.$$

The second switching control block may further include a non-interpolation control block according to another example.

The non-interpolation control block 400 may set a gray level value that cannot be restored depending on resolution of a display apparatus, which is a value corresponding to low gray among gamma gray values. In the examples of FIGS. 4 and 5, gamma gray values with levels 0 to 15 may be set as a non-interpolation range. However, the scope of the present disclosure is not limited thereto, and it may be set as different ranges such as predetermined low gray section, intermediate gray section, or high gray section, depending on the resolution of the display apparatus or the operating performance of the display apparatus.

As a result, because a decoder according to the examples may select and decode gamma gray level values, a number of gamma lines may be reduced and the size of a decoder itself including a pad connected to gamma lines may be reduced. Also, the reduction in the number of gamma lines may reduce the influence of parasitic capacitance.

Figure 6:
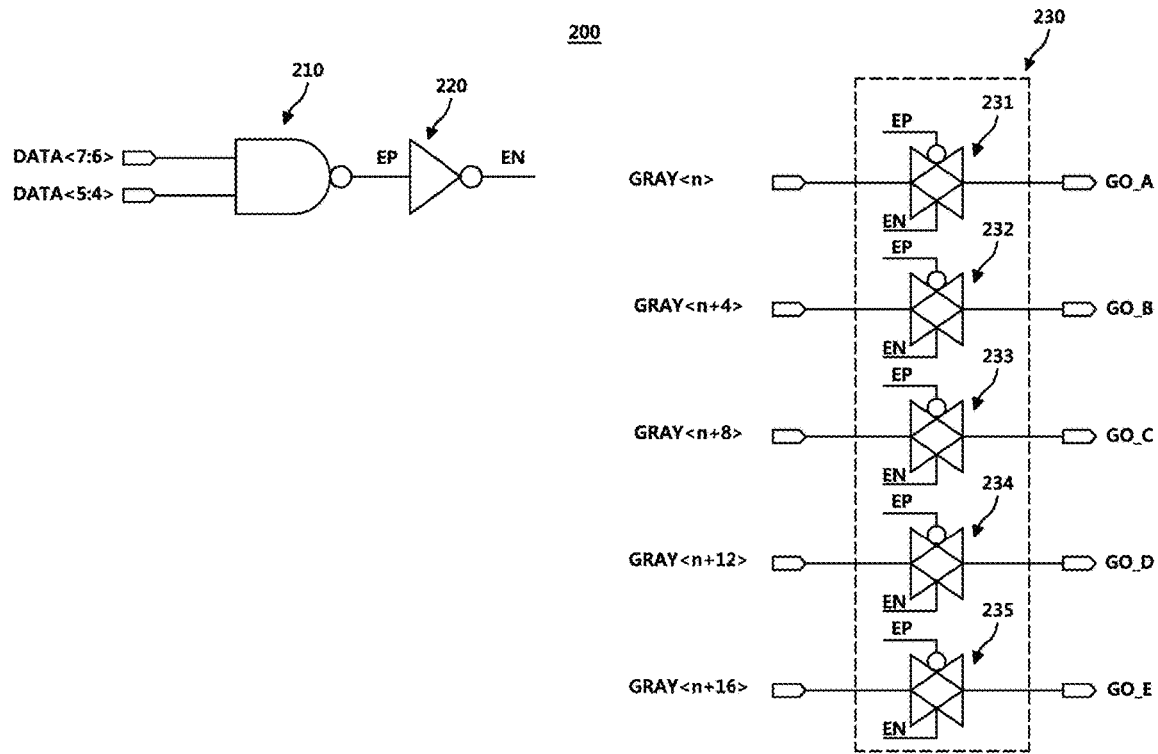
FIG. 6 is an example of a circuit diagram of a first switching control block in accordance with one or more embodiments.

FIG. 6 is an example of a circuit diagram of a first switching control block according to an example.

Referring to FIG. 6, a first switching control block 200 includes a NAND logic circuit 210, an inverter circuit 220, and a plurality of selectors 230.

The NAND logic circuit receives first high bits D[7:6] and second high bits D[5:4] and outputs a first enable signal EP.

The inverter circuit 220 inverts the first enable signal EP and generates a second enable signal EN.

The selectors 230 may be a circuit that selects representative values from a plurality of gamma lines, and may be implemented with a number of sections whose first unit section and second unit section are identical except for sections to which a non-interpolation control block 400 (FIG. 7) is connected. In the embodiment of FIG. 6, selection units 231 to 235 may be included in the first unit section, and if gamma gray level values having levels 0 to 15 are excluded when 256 steps of gamma gray level values are implemented, a total of 15×5=75 selectors may be included.

Figure 7:
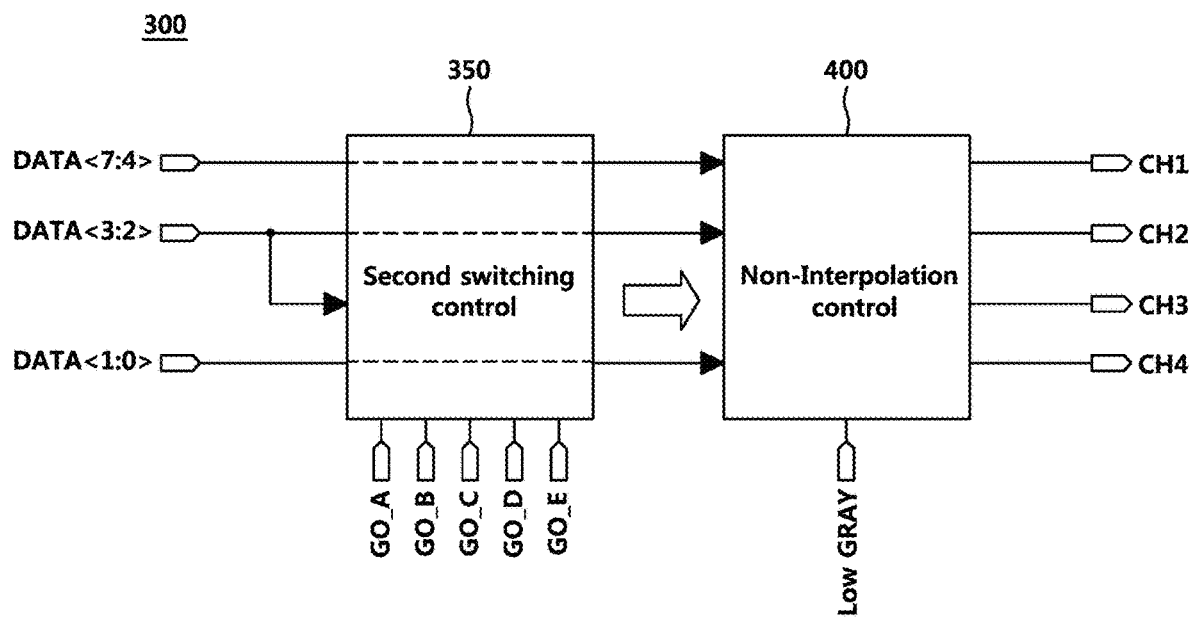
FIG. 7 is a block diagram of an example of a second switching control block in accordance with one or more embodiments.

FIG. 7 is a block diagram of an example of a second switching control block according to an example.

Referring to FIG. 7, the second switching control block 300 may include a second switching block 350 and a non-interpolation control block 400, and may output a low gray value as a channel value in regard to data corresponding to low gray (Data [7:0]). Referring to FIG. 5, for example, if a gamma gray level value is 0 and data is 00000000, the non-interpolation control block 400 outputs channel values CH1, CH2, CH3, CH4 as 0, 0, 0, 0.

The second switching control block 350 receives section values (Go_A, Go_B, Go_C, Go_D, Go_E) from the first switching control block 200, and combines the section values according to predetermined low bits D[3:0] to output channel values (CH1 to CH4).

The second switching control block 350 receives first low bits D[3:2] and selects two section values from section values. The non-interpolation control block 400 combines the section values selected based on second low bits D[1:0] to output channel values.

For example, if second low bits are first condition (00), one first section value (B) and three second section values (A) are output as channel values. For example, if second low bits are second condition (01), two first section values (B) and two section values (A) are output as channel values. For example, if second low bits are third condition (10), three first section values (B) and one second value (A) are output as channel values. For example, if second low bits are fourth condition (11), four one section value (B) are output as channel values.

Figure 8:
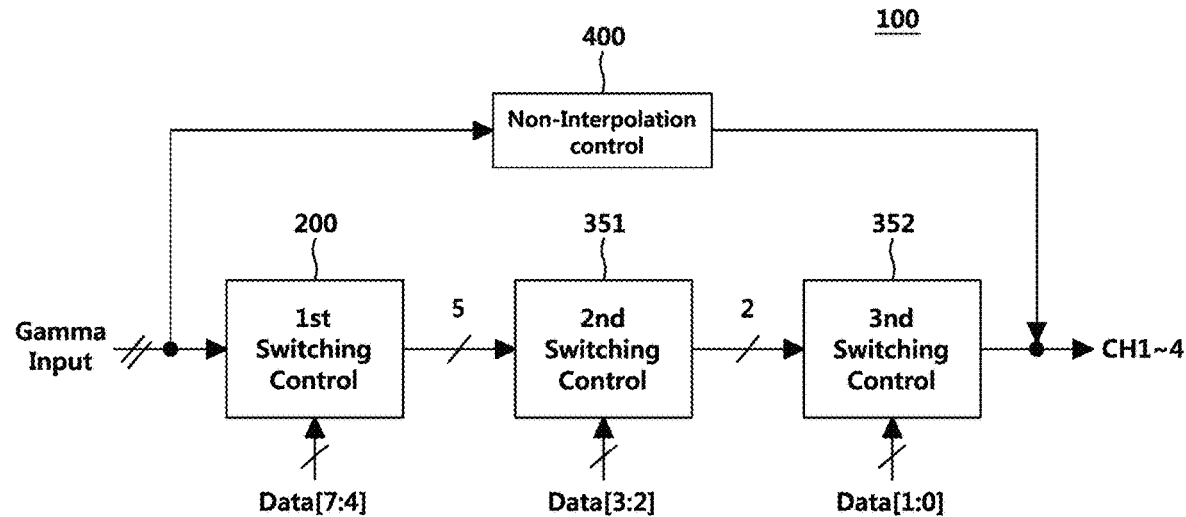
FIG. 8 is a block diagram of an example of a source driver in accordance with one or more embodiments.

FIG. 8 illustrates an example of a block diagram of a source driver according to an example. The example of FIG. 8 illustrates when the data input is 8 bits, and will be explained referring to FIG. 5.

Referring to FIG. 8, the decoder includes a first switching control block 200, a second switching control block 351, and a third switching control block 352. Each switching control block may also be referred to as a front-switching control block 200, an intermediate switching control block 351, and a rear switching control block 352.

The first switching control block 200 divides the plurality of gamma gray level values into four first sections based on the most significant four bits among 8-bit data, and each first section has two first section values (A-B or B-C or C-D or D-E). For example, when Data [7: 4]=0001, the first switching control block 200 outputs a total of five section values A, B, C, D and E to the second switching control block 351.

When five section values A, B, C, D and E are inputted, the second switching control block 351 outputs two second section values. The two second section values are selected from any one among a plurality of first section values based on two intermediate bits, Data[3:2]. For example, referring to FIG. 5, when Data [3: 2]=10, C and D become second section values among the five section values A to E.

The third switching control block 352 outputs a plurality of channel values by combining two second section values. The number of channel values may vary depending on the number of second section values. For example, if the number of second section value is M (M is a natural number), the number of channel values may be maximum 2M, but it may vary depending on the design. In the example of FIG. 5, if D [1: 0]=00, the channel value is outputted as three C and one D.

The decoder 100 may further include a non-interpolation control block 400 that does not perform interpolation corresponding to a first switching control block to a third switching control block for a predetermined section.

Figure 9:
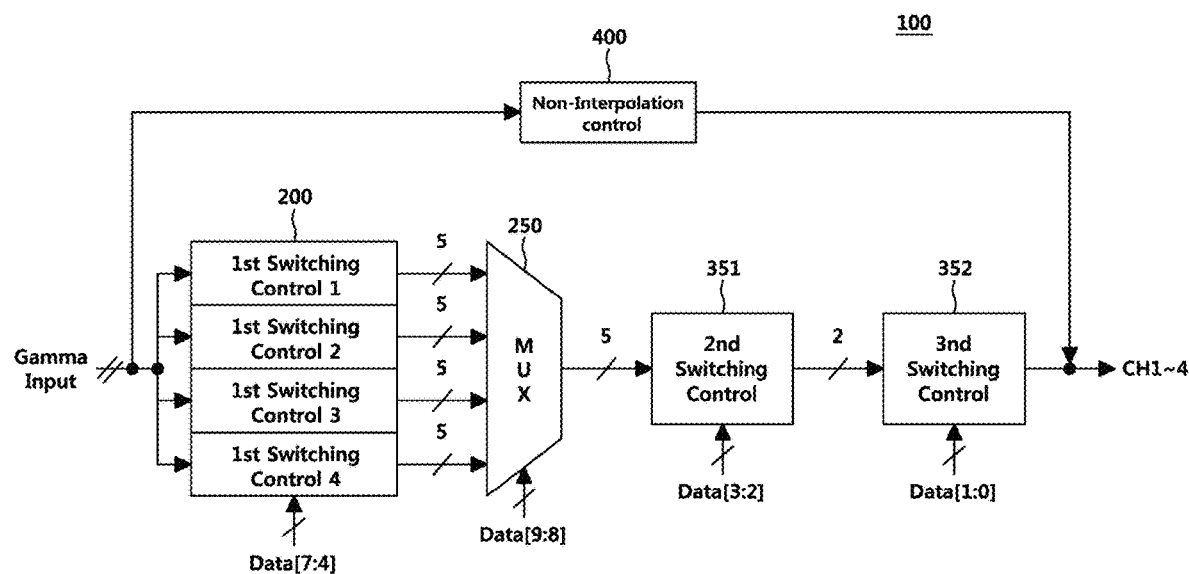
FIG. 9 is an example of a circuit diagram of a source driver in accordance with one or more embodiments.

FIG. 9 illustrates an example of a circuit diagram of a source driver.

FIG. 9 assumes that the resolution of the display panel is increased. FIG. 8 is described based on 256 gray levels and 8 bits of data. However, FIG. 9 assumes that gamma gray level value exceeds 256 gray levels and 8 bits of data.

The decoder 100 of FIG. 9 includes a plurality of first switching control blocks 200, a multiplexer 250, a second switching control block 351, and a third switching control block 352. The detailed description will be omitted since it overlaps with FIG. 8.

The third switching control block 352 combines two last section values based on the two least significant bits Data [1: 0] among data of N bits, and outputs the result as the plurality of channel values. The second switching control block 351 outputs five intermediate section values as the two final section values based on two first data D [3: 2] which is two bits before the least significant bit among data of N bits.

In the example of FIG. 9, a plurality of first switching control blocks 200 are included, which differs from FIG. 8. When data is greater than 8 bits (N>8), the number of the first switching control blocks 200 becomes $2^{(N-8)}$. For example, when data is 10 bits, the number of the first switching control blocks 200 included in the decoder 100 is $2^{(10-8)}=4$.

The multiplexer 250 may select any one of the plurality of first switching control blocks 200, and connect the selected multiplexer to the second switching control block 351. More specifically, referring to FIG. 5, if the data is 10 bits, the section where the eight bits from the least significant D[7: 0] is from [00010000] to [00011111] is repeated 4 times according to the number of examples of bit D [9: 8] of the most significant two bits (total 10 bits-8 bits). In this case, one section is selected according to D [9: 8] and connected to the second switching control block 351.

If data is 12 bits, the section where D [7: 0] is from [00010000] to [00011111] is repeated a total of 16 times according to 4 most significant bits (=total 12 bits-8 bits). In this example, the multiplexer can be implemented in two levels. More specifically, a first multiplexer may select any one of the first multiplexers corresponding to D[7:0] based on D[9:8] and connect the selected multiplexer to a second multiplexer. The second multiplexer may select any one of the four first multiplexers based on one D[11:10] and connect the selected multiplexer to the second switching control block 351.

The decoder 100 may further include a non-interpolation control block 400 that does not perform interpolation corresponding to the first switching control block to the third switching control block for a predetermined gray section.

Figure 10:
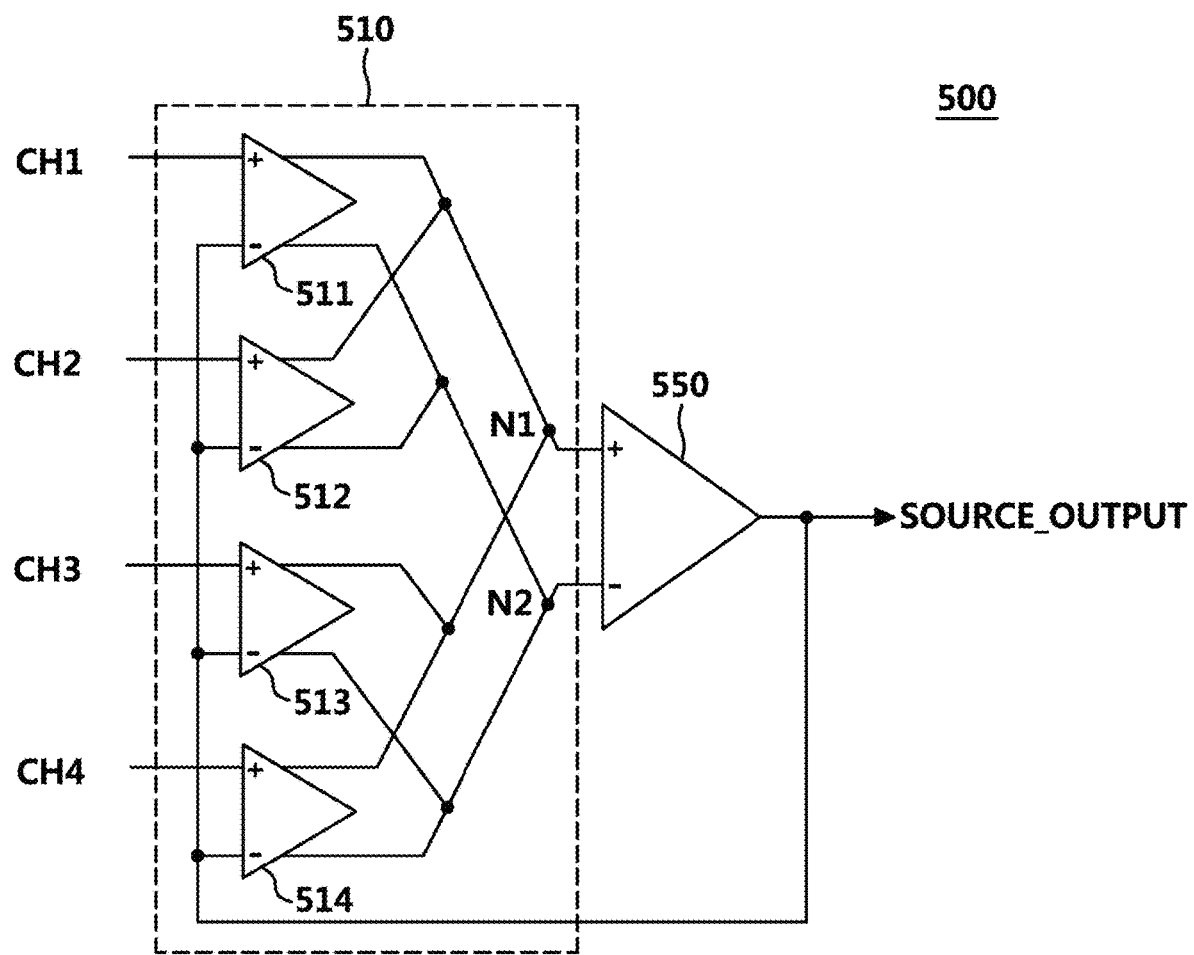
FIG. 10 is an example of a circuit diagram of an amplification unit in accordance with one or more embodiments.

FIG. 10 illustrates an example of a circuit diagram of an amplifier.

An amplifier 500 may include a plurality of amplifiers.

For example, as illustrated in FIG. 10, the amplifier 500 may be implemented in amplification devices of two stages. When there are four channel values, there may be included a first amplifier 510 that receives and amplifies two channel values and two luminance values feeding back, and a second amplifier 550 that adds the output values of the first amplifier 510 to output an averaged luminance value.

The first amplifier 510 may include a plurality of individual amplifiers 511-514. the number of the individual amplifiers that are included in the first amplifier 510 may depend on the number of input channels in the amplifier 500. The four channel values are applied respectively to a positive input of each of the individual amplifiers 511-514. The feedback value of SOURCE_OUTPUT is applied to a negative input of all of the individual amplifiers 511-514. The output of an individual amplifier may be connected with the output of an adjacent individual amplifier.

For example, the positive outputs of a first individual amplifier 511 and a second individual amplifier 512 may be connected to each other as a node N1. The negative outputs of the first individual amplifier 511 and the second individual amplifier 512 may be connected to each other as a node N2. The positive outputs of a third individual amplifier 513 and a fourth individual amplifier 514 may be connected to each other as the node N1. The negative outputs of the third individual amplifier 513 and the fourth individual amplifier 514 may be connected to each other as the node N2. The nodes N1 and N2 may have a summing value of a plurality of the outputs of the individual amplifiers, respectively. The nodes N1 and N2 may be applied to inputs of the second amplifier 550. The second amplifier 550 may have two inputs N1, N2 and output SOURCE_OUTPUT as an averaged value.

In the above example, if second low bits are first condition (00), the channel values CH1, CH2, CH3, CH4 are A, A, A, B and the luminance value SOURCE_OUTPUT is $$\frac{(A \times 3 + B \times 1)}{4};$$

if second low bits are second condition (01), the channel values CH1, CH2, CH3, CH4 are A, A, B, B and the luminance value SOURCE_OUTPUT is $$\frac{(A \times 2 + B \times 2)}{4};$$

if second low bits are third condition (10), the channel values CH1, CH2, CH3, CH4 are A, B, B, B and the luminance value SOURCE_OUTPUT is $$\frac{(A \times 1 + B \times 3)}{4};$$

and if second low bits are fourth condition (11), the channel values CH1, CH2, CH3, CH4 are B, B, B, B and the luminance value SOURCE_OUTPUT is $$\frac{(A \times 0 + B \times 4)}{4}.$$

Figure 11:
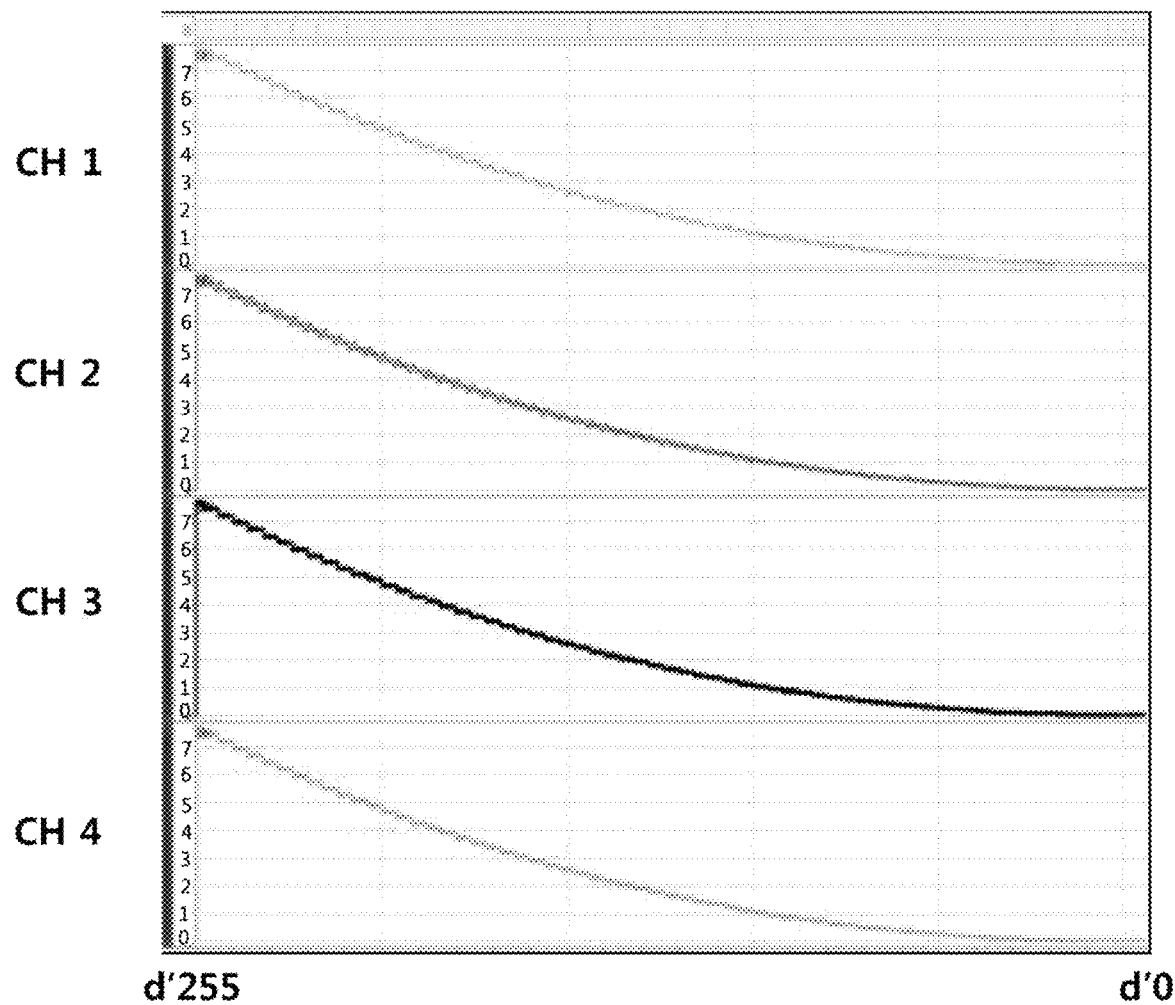
FIG. 11 is a graph illustrating the output of channel values in accordance with one or more embodiments.
Figure 12:
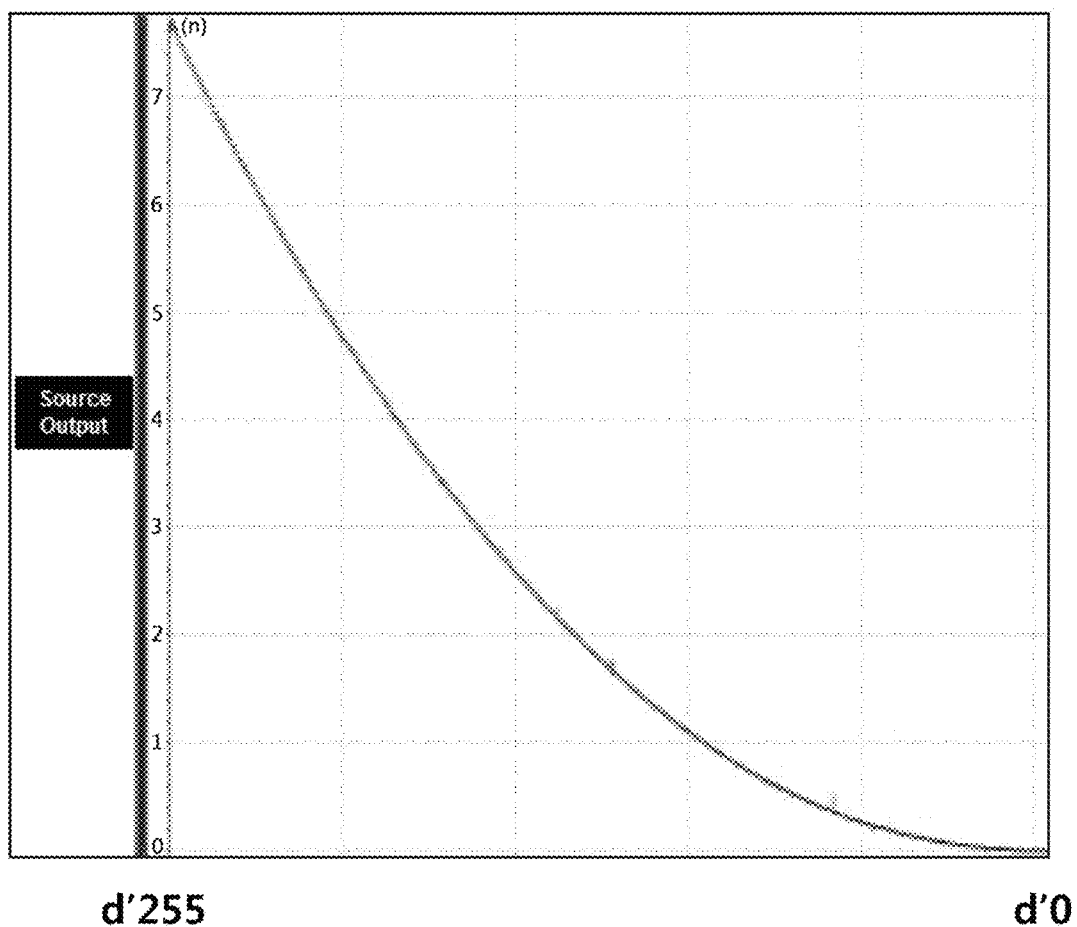
FIG. 12 is a graph illustrating the output of luminance values in accordance with one or more embodiments.

FIG. 11 is a graph illustrating the output of channel values according to an example, and FIG. 12 is a graph illustrating the output of luminance values according to another example.

Referring to FIG. 11, as to data of 256 levels, gray values are output in each channel of a decoder according to an example as illustrated. The graphs of output values CH1, CH2, CH3, CH4 of respective channels may not be the same because they are output by combining section values, as described above. However, it is seen that, if all channel values are represented with averaged values and non-interpolation gray level values, gamma gray values can be fully restored (that is, Full Gray) as shown in FIG. 12.

A decoder according to the various examples may select and decode gamma gray level values, the size of the decoder itself as well as gamma lines may be reduced.

A decoder according to the various examples may reduce the number of gamma lines such that the influence of parasitic capacitance can be reduced.

A source driver according to the various examples may reduce a circuit area by reducing the size of the decoder, thereby making a driving circuit thinned and smaller while maintaining high resolution of the display apparatus.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A display apparatus comprising a source driver including a decoder and an amplifier, the decoder comprising:
   a first switching control block configured to select at least two first section values from gamma gray level values based on predetermined high bits of inputted data; and
   a second switching control block configured to select second section values from the at least two selected section values based on predetermined low bits of the data and output the selected second section values as at least two channel values,
   wherein the amplifier comprises first individual amplifiers configured to receive and amplify respective channel values and a luminance value, and a second amplifier configured to output the luminance value obtained by adding and averaging output values of the first individual amplifiers.

2. The display apparatus of claim 1, wherein, when the gamma gray level values are in a configuration section, the second switching control block comprises a non-interpolation control block that is configured to output the gamma gray level values themselves as the channel values based on the inputted data.

3. The display apparatus of claim 2, wherein the configuration section is one of a predetermined low gray section, an intermediate gray section, and a high gray section.

4. The display apparatus of claim 1, wherein the first switching control block is configured to select the at least two first section values from the plurality of gamma gray level values based on first high bits of the predetermined high bits and second high bits of the predetermined high bits.

5. The display apparatus of claim 4, wherein the first switching control block comprises:
   a NAND logic circuit configured to output a first enable signal based on the first high bits and the second high bits;
   an inverter (NOT) circuit configured to receive the first enable signal and output a second enable signal; and
   selectors configured to select the at least two first section values from the gamma gray level values based on the first enable signal and the second enable signal.

6. The display apparatus of claim 1, wherein the second switching control block is configured to select the at least two second section values based on first low bits, and combine and output the selected at least two second section values based on second low bits as the at least two channel values.

7. The display apparatus of claim 6, wherein:
if the second low bits are a first condition, the second switching control block selects three first section values and one second section value;
if the second low bits are a second condition, the second switching control block selects two first section values and two second section values;
if the second low bits are a third condition, the second switching control block selects one first section value and three second section values; and
if the second low bits are a fourth condition, the second switching control block selects zero first section value and four second section values.

8. A driving method of a display apparatus for outputting channel values by receiving first data comprising a plurality of bits and second data comprising a plurality of level values, the method comprising:
selecting a plurality of section values from the second data based on a predetermined number of high bits of the first data; and
selecting and outputting at least two section values from the plurality of section values as channel values based on a predetermined number of low bits of the first data, wherein the selecting the at least two section values as channel values comprises selecting the section values based on first low bits while the high bits of the first data are the same; and combining the selected section values based on changing second low bits while the first low bits are the same.

9. The method of claim 8, wherein if the high bits of the first data are a predetermined non-interpolation condition, the method further comprises outputting a level value corresponding to the second data as the outputted channel value.

10. The method of claim 8, wherein the channel values comprise four channel values, and the combining of the selected section values comprises:
selecting three of first section values and one of second section values if the second low bits are a first condition;
selecting two of the first section values and two of the second section values if the second low bits are a second condition;
selecting one of the first section values and three of the second section values if the second low bits are a third condition; and
selecting zero of the first section values and four of the second section values if the second low bits are a fourth condition.

11. The method of claim 8, wherein the section values are output values corresponding to values where the high bits of the first data and first low bits are identical and the second low bits are all 1.

12. The method of claim 8, further comprising:
averaging the channel values to output a luminance value, wherein the first data is data input from a main controller, and the second data is a gamma gray level value input from a gamma block.

13. A display apparatus comprising a decoder and a source driver, wherein the decoder comprises: a non-interpolation control block configured to output gamma gray level values of a predetermined section among a plurality of gamma gray level values as channel values; a first switching control block configured to select a plurality of section values among remaining gamma gray level values based on predetermined high bits of data inputted from a main controller; and a second switching control block configured to combine the selected plurality of section values based on remaining low bits of the data and output the combination of the plurality of section values as a plurality of channel values, and wherein the source driver is configured to average the plurality of channel values and output the averaged value as a luminance value, and wherein when the plurality of gamma gray level values are divided into predetermined sections, a maximum number of section values is set among the plurality of gamma gray level values in each of the predetermined sections.

14. The display apparatus of claim 13, wherein the second switching control block is further configured to select the plurality of section values as $2^n$ combinations, and output the combinations of the section values as the plurality of channel values, if the number of the remaining low bits are n, wherein n is a positive integer.

15. A display apparatus comprising a decoder and a source driver, the source driver is configured to average a plurality of channel values and output an averaging value as a luminance value, wherein the decoder is configured to output the plurality of channel values by receiving N bits data and a plurality of gamma gray level values, and wherein the decoder comprises: a rear switching control block configured to combine two first section values to interpolate into the plurality of channel values based on the least significant two bits of the N bits data, an intermediate switching control block configured to interpolate five second section values into the two first section values based on two middle bits before the least significant two bits in the N bits data; and a front switching control block configured to interpolate the plurality of gamma gray level values into the five second section values based on four forward bits before two middle bits of the N bits data, wherein N is a natural number a positive integer.

16. The display apparatus of claim 15, wherein the data is more than 8 bits (N>8),
wherein a number of the front switching control blocks is as twice as many as a number of rest bits,
wherein the rest bits are at least two bits from the most significant bit to the front bit of the four forward bits in the N bits data, and
wherein the decoder further comprises a multiplexer configured to select any one of the plurality of the front switching control blocks based on the rest bits, and output the five second section values to the intermediate switching control block.

17. The display apparatus of claim 15, wherein the decoder further comprises a non-interpolation control block configured to output the gamma gray level values of a predetermined section among the plurality of gamma gray level values as a channel value.

18. A display apparatus comprising:
a decoder comprising:
a front switching control block configured to divide a plurality of gamma gray levels into a predetermined number of sections based on the most significant four bits among 8-bit data and output five section values;
an intermediate switching control block configured to select and output two section values from the five section values, and
a rear switching control block configured to output a plurality of channel values by combining the two section values.

* * * * *